(12) United States Patent
Ku et al.

(10) Patent No.: US 11,832,402 B2
(45) Date of Patent: Nov. 28, 2023

(54) MOVABLE LOCKING EAR AND ELECTRICAL DEVICE INCLUDING THE SAME

(71) Applicants: Chieh-We Ku, Taipei (TW); Chia-Lin Chang, Taipei (TW); Yu-Ping Weng, Taipei (TW); Chih-Nan Chen, Taipei (TW)

(72) Inventors: Chieh-We Ku, Taipei (TW); Chia-Lin Chang, Taipei (TW); Yu-Ping Weng, Taipei (TW); Chih-Nan Chen, Taipei (TW)

(73) Assignee: ELITEGROUP COMPUTER SYSTEMS CO., LTD., Taipei (TW)

( * ) Notice: Subject to any disclaimer, the term of this patent is extended or adjusted under 35 U.S.C. 154(b) by 56 days.

(21) Appl. No.: 17/734,000

(22) Filed: Apr. 30, 2022

(65) Prior Publication Data
US 2022/0361349 A1    Nov. 10, 2022

(30) Foreign Application Priority Data
May 5, 2021    (TW) .................................. 110116307

(51) Int. Cl.
*H05K 5/02*    (2006.01)
*H05K 5/00*    (2006.01)

(52) U.S. Cl.
CPC ......... *H05K 5/0221* (2013.01); *H05K 5/0073* (2013.01)

(58) Field of Classification Search
None
See application file for complete search history.

(56) References Cited

U.S. PATENT DOCUMENTS

| | | | | |
|---|---|---|---|---|
| 4,007,516 A | * | 2/1977 | Coules | F16B 21/04 411/548 |
| 4,143,577 A | * | 3/1979 | Eberhardt | F16B 9/07 411/548 |
| 4,622,725 A | * | 11/1986 | Bumgardner | F16B 21/02 24/297 |
| 5,167,465 A | * | 12/1992 | Inui | H02B 1/044 403/348 |
| 5,378,075 A | * | 1/1995 | Mitchell | F16B 2/16 403/314 |
| 6,028,276 A | * | 2/2000 | Takano | H01H 9/02 200/295 |
| 6,056,577 A | * | 5/2000 | Blanchet | H01R 13/639 439/352 |

(Continued)

*Primary Examiner* — Xanthia C Relford (57) ABSTRACT

The invention discloses a movable locking ear and an electrical device. The electrical device comprises a frame and a movable locking ear. The frame comprises a first recess, a second recess opposite to the first recess, and a side wall between the first recess and the second recess. The movable locking ear comprises a first fastening member for fastening the first recess, a second fastening member opposite to the second fastening member for fastening the second recess, and a resisting member between the first fastening member and the second fastening member. A position of a bending end of the resisting member is near or far from the side wall depending on a distance between the first fastening member and the second fastening member.

10 Claims, 8 Drawing Sheets

(56) References Cited

U.S. PATENT DOCUMENTS

| | | | | |
|---|---|---|---|---|
| 6,243,928 B1* | 6/2001 | Powell | ................... | F16B 2/02 |
| | | | | 24/297 |
| 7,640,707 B2* | 1/2010 | Johnson | ................ | F16B 21/084 |
| | | | | 52/489.1 |
| 8,672,425 B2* | 3/2014 | Yamanaka | ............... | H04N 5/64 |
| | | | | 248/220.21 |
| 8,708,595 B2* | 4/2014 | Tseng | ..................... | F16B 5/10 |
| | | | | 403/325 |
| 9,574,596 B2* | 2/2017 | Zhou | .................. | F16L 21/007 |
| 9,577,365 B1* | 2/2017 | Herbrechtsmeier | . | H01R 13/518 |
| 10,554,007 B2* | 2/2020 | Herbrechtsmeier | . | H01R 13/514 |
| 11,202,381 B2* | 12/2021 | Miyake | ............... | H05K 5/0013 |
| 2008/0023616 A1* | 1/2008 | Arakawa | ............. | A47F 5/0892 |
| | | | | 108/42 |
| 2008/0041027 A1* | 2/2008 | Qualie | ................. | B02C 18/18 |
| | | | | 56/289 |
| 2009/0266959 A1* | 10/2009 | Lee | ......................... | H04R 1/08 |
| | | | | 248/279.1 |
| 2014/0182662 A1* | 7/2014 | West | ..................... | H02S 30/10 |
| | | | | 248/617 |
| 2014/0286730 A1* | 9/2014 | Zhou | ................... | F16B 21/073 |
| | | | | 411/511 |
| 2019/0103738 A1* | 4/2019 | Aichi | .................. | H05K 7/026 |
| 2020/0396854 A1* | 12/2020 | Fan | ......................... | G06F 1/16 |
| 2021/0214956 A1* | 7/2021 | Bergelin | ........... | E04F 15/02044 |
| 2021/0372171 A1* | 12/2021 | Valdes Rudd | ......... | E05B 81/08 |
| 2022/0154746 A1* | 5/2022 | Farrar | .................. | B65D 85/30 |
| 2022/0418130 A1* | 12/2022 | Weber | ................... | H02B 1/44 |
| 2023/0155313 A1* | 5/2023 | Bae | ..................... | H01R 13/443 |
| | | | | 439/892 |

\* cited by examiner

MOVABLE LOCKING EAR AND ELECTRICAL DEVICE INCLUDING THE SAME

CROSS REFERENCE TO RELATED APPLICATION

The present application claims priority to Taiwan patent application Serial No. 110116307 filed on May 5, 2021, the entire content of which is incorporated by reference to this application.

BACKGROUND OF THE INVENTION

1. Field of the Invention

The present invention pertains to a movable locking ear and electrical device including the same, more specifically to a movable locking ear with quick-detachable and electrical device including the same.

2. Description of the Prior Art

In general, some electronic components in the electronic product can be locked on the circuit board by locking means to keep the electronic components at fixed positions, and avoid that the electronic product can't work, which caused by an electrically connection of the electronic components is abnormal because of the movement of the electronic components crashed and resulting to make.

Figure 1A:
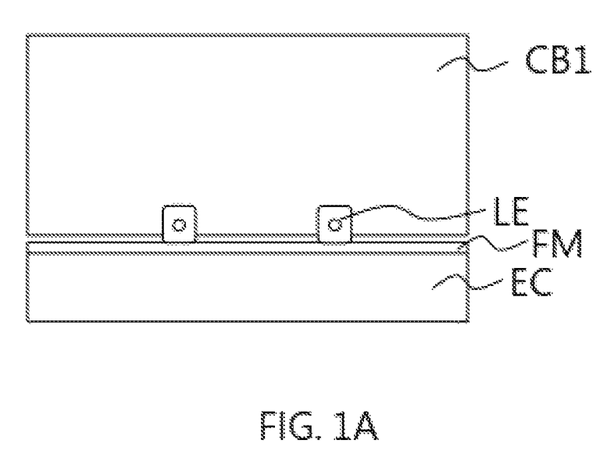
FIG. 1A is a schematic diagram of locking the electronic component on the first circuit board by the fixed locking ear in accordance with prior art.
Figure 1B:
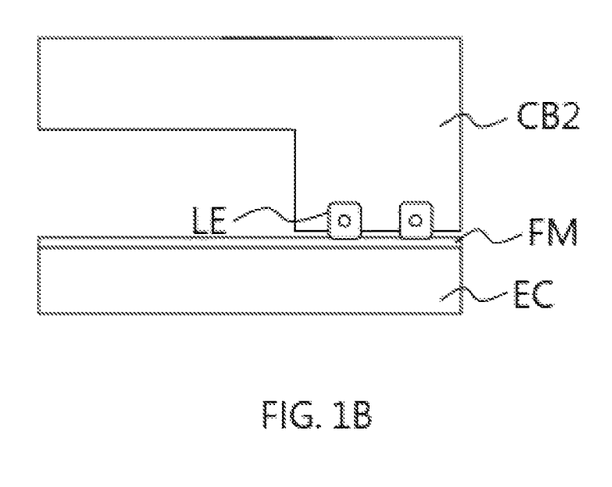
FIG. 1B is a schematic diagram of locking the electronic component on the second circuit board by the fixed locking ear in accordance with prior art.

Please refer to FIG. 1A and FIG. 1B. FIG. 1A is a schematic diagram of locking the electronic component on the first circuit board by the fixed locking ear in accordance with prior art. FIG. 1B is a schematic diagram of locking the electronic component on the second circuit board by the fixed locking ear in accordance with prior art. As shown in FIG. 1A, two fixed locking ears LE are extend from a frame FM of electronic component EC, and positions of the two fixed locking ears LE are corresponding to positions of screw holes of the a first circuit board CB1, thereby the electronic components EC may be locked on the first circuit board CB1 by the two fixed locking ears LE. As shown in FIG. 1B, the two fixed locking ear LE extend from the frame FM of the electronic component EC, and positions of the fixed locking ears LE are corresponding to positions of screw holes of a second circuit board CB2, thereby the electronic components EC can be locked on the second circuit board CB2 by the two fixed locking ears LE.

From the above example, it can be known that the type of the circuit board is designed correspondingly according to electronic products or space constraints, such as rectangular type (e.g. the first circuit board CB1 in FIG. 1A) or L-shaped type (e.g. the second circuit board CB2 in FIG. 1B). In addition, the configurations, including the number and position, of screw holes of the circuit boards with different types are also different, so the fixed locking ears LE with fixed number and fixed position obviously can't be applied to the circuit boards with different types. In other words, in order to lock the electronic components on the different circuit boards, the number and position of the fixed locking ears LE need to be designed correspondingly to fit the circuit board with different types, but it's causing high time cost and manufacturing cost. Accordingly, a new electrical device fitting the circuit boards with different types is needed which should be able to lock an electronic component on the circuit boards with the different types.

SUMMARY OF THE INVENTION

The present invention provides a movable locking ear clamping the frame selectively, sliding relative to or separating from the frame because of quick-detachable.

The present invention discloses a movable locking ear comprising a first fastening member, a second fastening member and resisting member. The resisting member is located between the first fastening member and the second fastening member, and the resisting member has a bending end. When a distance between the first fastening member and the second fastening member is less than a preset distance, the bending end protrudes from a preset position. When the distance between the first fastening member and the second fastening member isn't less than the preset distance, the bending end doesn't protrude from the present position.

In some embodiments, the movable locking ear is for fastening a frame selectively. The frame comprises a first recess, a second recess opposite to the first recess and a side wall located between the first recess and the second recess, the first fastening member is for fastening the first recess, and the second fastening member is for fastening the second recess. When the distance between the first fastening member and the second fastening member is a first distance, the bending end resists the side wall, and the preset distance is greater than the first distance. The movable locking ear further comprises a fastener and a fixed member, the fastener penetrates the first fastening member, the resisting member and the second fastening member sequentially, and the fastener and the fixed member are used to keep the distance between the first fastening member and the second fastening member of the first distance.

In some embodiments, the first fastening member comprise a first body and a first clamp portion. The first clamp portion extends from an end of the first body and is for fastening a first recess of the frame. The second fastening member comprises a second body and a second clamp portion. The second clamp portion extends from an end of the second body, and is for fastening a second recess of the frame. Besides, the resisting member comprises a first contact portion, a second contact portion, a first bending portion and a second bending portion. The first contact portion contacts the first body of the first fastening member, and the second contact portion contacts the second body of the second fastening member. The first bending portion is located between the first contact portion and the second contact portion, and has a bending end. The second bending portion is located between the first contact portion and the second contact portion, and has a stress balancing end at a position relative to the first bending portion.

The present invention provides an electrical device clamping the on object to be fixed on the circuit boards with different shapes through a clamping mechanism of the movable locking ear and the frame.

The present invention provides an electrical device comprising a frame and a movable locking ear. The frame has first recess, a second recess opposite to the first recess and a side wall located between the first recess and the second recess. The movable locking ear comprise a first fastening member, a second fastening member and a resisting member. The first fastening member is for fastening first recess. The second fastening member is opposite to the first fastening member, and is for fastening second recess. The resisting member disposed between the first fastening member and the second fastening member, and having a bending end. A position of the bending end is near to or far from the side wall with the distance between the first fastening member and the second fastening member.

In some embodiments, when the distance between the first fastening member and the second fastening member is between a preset distance and a first distance, the bending end doesn't resist the side wall, and the preset distance is greater than the first distance. The first fastening member comprises a first body and a first clamp portion, the first clamp portion extends from an end of the first body, and the first fastening member is for fastening the first recess of the frame; and the second fastening member comprises a second body and a second clamp portion, the second clamp portion extends from an end of the second body, and the second fastening member is for fastening the second recess of the frame. Besides, the resisting member comprises a first contact portion contacting, a second contact portion, a first bending portion and a second bending portion. The first contact portion contacts a first body of the first fastening member. The second contact portion contacts a second body of the second fastening member. The first bending portion is located between the first contact portion and the second contact portion, and has the bending end. The second bending portion is located between the first contact portion and the second contact portion, and has a stress balancing end In summary, according to the movable locking ear provided by the present invention, an user can change the distance between the first fastening member and the second fastening member to the first distance or the second distance by adjusting the fastener and the fixed member, so the movable locking ear can clamp frame, or slide relative to or separate from the frame. Comparing with the fixed locking ear with of prior art, the movable locking ears with quick-detachable of the present invention has high flexibility and applicability. In addition, the electrical device provided by the present invention can clamp any positions of the frame because of the movable locking ears with quick-detachable, so the configurations of the movable locking ears can fit with the configurations corresponding to the screw holes of the circuit boards with different types, and make the object to be fixed on the circuit boards with different types.

DETAILED DESCRIPTION OF THE INVENTION

The features, objectives, and functions of the present invention are further disclosed below. However, it is only a few of the possible embodiments of the present invention, and the scope of the present invention isn't limited thereto; that is, the equivalent changes and modifications done in accordance with the claims of the present invention will remain the subject of the present invention. Without departing from the spirit and scope of the invention, it should be considered as further enablement of the invention.

Figure 2:
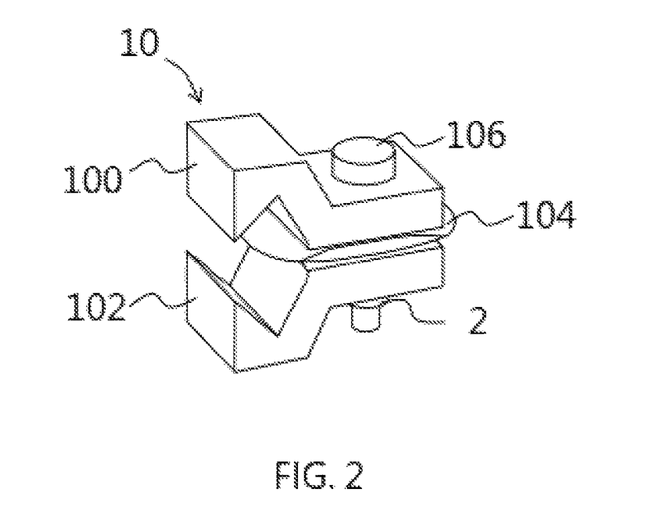
FIG. 2 is a schematic diagram of the movable locking ear and the fixed member.
Figure 3:
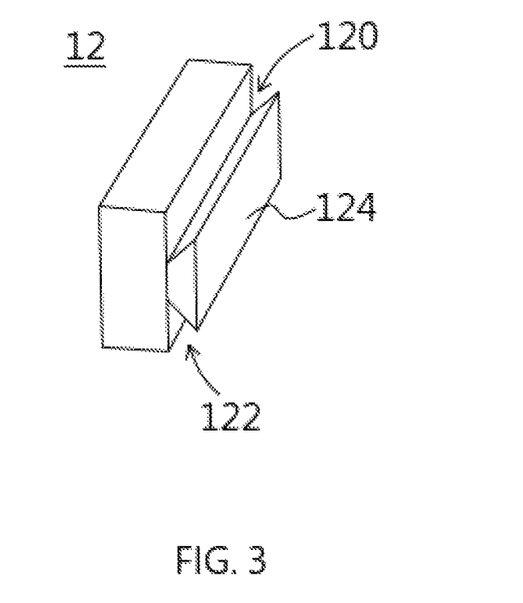
FIG. 3 is a perspective view of the frame in accordance with the present invention.

Please refer FIG. 2 and FIG. 3, FIG. 2 is a schematic diagram of the movable locking ear and the fixed member, and FIG. 3 is a perspective view of the frame in accordance with the present invention. A movable locking ear 10 is used to fasten selectively a frame 12. In detail, as shown in FIG. 2, the movable locking ear 10 comprises a first fastening member 100, a second fastening member 102 opposite to the first fastening member 100 and a resisting member 104 disposed between the first fastening member 100 and the second fastening member 102. As shown in FIG. 3, the frame 12 comprises a first recess 120, a second recess 122 opposite to a first recess 120 and a side wall 124 located between first recess 120 and second recess 122. The first fastening member 100 and the second fastening member 102 of the movable locking ear 10 may clamp the first recess 120 and the second recess 122 of the frame 12, respectively. In some embodiments, the movable locking ear 10 further comprises a fastener 106 penetrating sequentially through the first fastening member 100, the resisting member 104, the second fastening member 102 and a fixed member 2, and the fastener 106 keeps a distance between the first fastening member 100 and the second fastening member 102 of a specific distance.

Figure 4A:
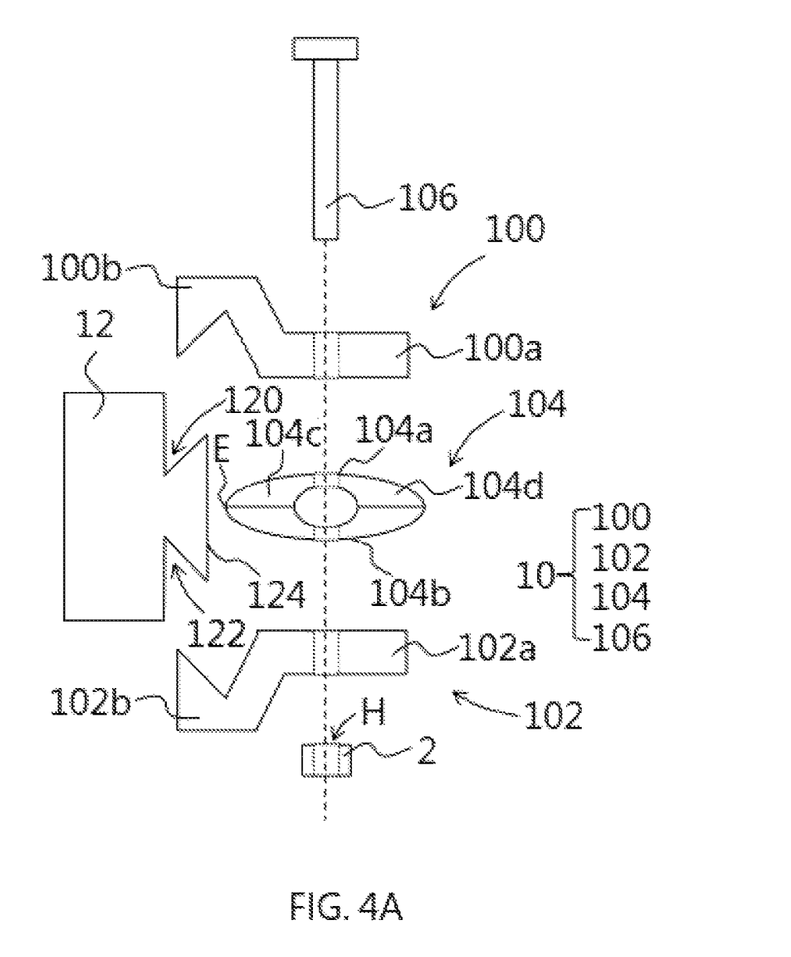
FIG. 4A is a side view of the movable locking ear, the fixed member and the frame in accordance with the present invention.

In this embodiment, the fastener 106 is a screw, and the fixed member 2, such as a nut, has a screw hole H (as shown in FIG. 4A) corresponding the fastener 106. It should be noted that the structures and the fitting relationship of the fastener 106 and the fixed member 2 are provided merely for exemplary purposes, but it's not limited thereto. That is to say, the structures and the fitting relationship of the fastener 106 and the fixed member 2 that can keep the distance between the first fastening member 100 and the second fastening member 102 of the specific distance belong the scope of the present invention.

Figure 4B:
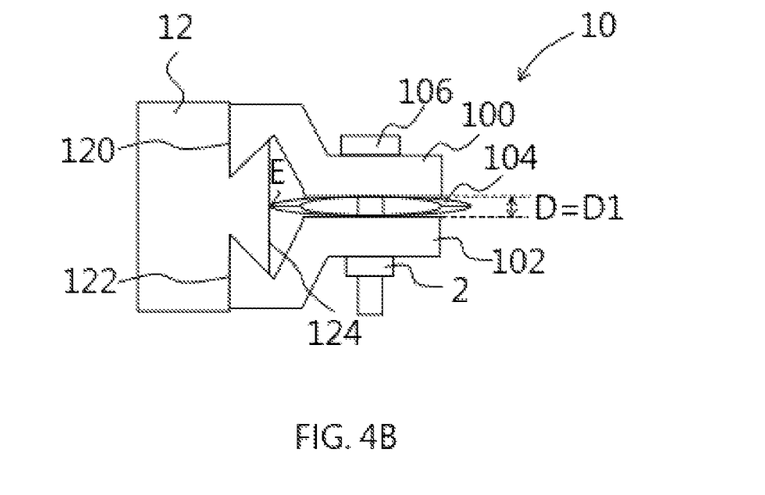
FIG. 4B is a side view that the movable locking ear has fastened the frame in accordance with the present invention.
Figure 4C:
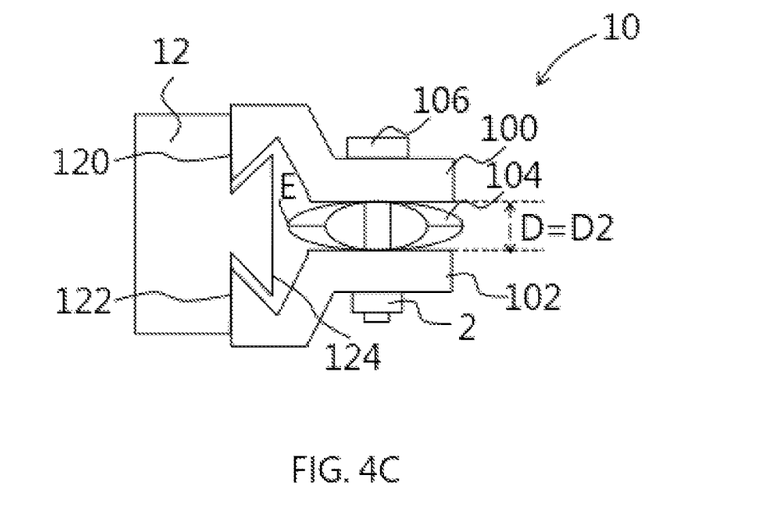
FIG. 4C is a side view that the movable locking ear has not fastened the frame in accordance with the present invention.

Then further explain the clamping mechanism of the movable locking ear 10 and frame 12 below. Please refer FIG. 4A, FIG. 4B and FIG. 4C. FIG. 4A is a side view of the movable locking ear, the fixed member and the frame in accordance with the present invention. FIG. 4B is a side view that the movable locking ear has fastened the frame in accordance with the present invention. FIG. 4C is a side view that the movable locking ear has not fastened the frame in accordance with the present invention.

As shown in FIG. 4A, the first fastening member 100 of the movable locking ear 10 comprises a first body 100a and a first clamp portion 100b extending from an end of the first body 100a. The first clamp portion 100b corresponds to the first recess 120 of the frame 12, so they could be clamped to each other. The second fastening member 102 of the movable locking ear 10 comprises a second body 102a and a second clamp portion 102b extending from an end of the second body 102a. The second clamp portion 102b corresponds to the second recess 122 of the frame 12, so they could be clamped to each other. The resisting member 104 comprises a first contact portion 104a, a second contact portion 104b, a first bending portion 104c and a second bending portion 104d. The first contact portion 104a contacts the first body 100a of the first fastening member 100. The second contact portion 104b contacts the second body 102a of the second fastening member 102. The first bending portion 104c is connected between the first contact portion 104a and second contact portion 104b, and near to a side of the side wall 124. The first bending portion 104c has a bending end E, and a position of the bending end E changes, specifically is near to or far from the side wall 124, with a distance the first fastening member 100 and the second fastening member 102 caused by an interaction between the fastener 106 and the fixed member 2. In some embodiments, the resisting member 104 may be, but not limited to, a circular and elastic component.

As shown in FIG. 4B, the first fastening member 100 and the second fastening member 102 of the movable locking ear 10 have already clamped the first recess 120 and the second recess 122 of the frame 12 respectively. After that, the distance D between the first fastening member 100 and the second fastening member 102 changes to a first distance D1, the resisting member 104 disposed between the first fastening member 100 and the second fastening member 102 is compressed, and the bending end E of the first bending portion 104c resists the side wall 124. Then, the distance D between the first fastening member 100 and the second fastening member 102 is kept at the first distance D1 by a clamping force from the fastener 106 and the fixed member 2, so the movable locking ear 10 clamps the frame 12 because of the balanced force. Meanwhile, the first bending portion 104c and the second bending portion 104d are made of the same material, and compressed by the first fastening member 100 and the second fastening member 102, so the second bending portion 104d is under the stress as same as the first bending portion 104c. In practice, as an end of the first bending portion 104c is defined as the ending end E, a position corresponding to the bending end E of the second bending portion 104d is defined as a stress balancing end to counterbalance a resilience of the bending end E. In an example, the second bending portion 104d (such as the stress balancing end) can make the first fastening member 100 and the second fastening member 102 be approximately parallel (equispaced) to each other, and avoid the fastening member 100 and the second fastening member 102 tilting because of a push from the first bending portion 104c.

As shown in FIG. 4C, the first fastening member 100 and the second fastening member 102 of the movable locking ear 10 don't clamp the first recess 120 and the second recess 122 of the frame 12 respectively. After that, the distance D between the first fastening member 100 and the second fastening member 102 changes from the first distance D1 to a second distance D2 greater than the first distance D1, a degree of compression of the resisting member 104 between the first fastening member 100 and the second fastening member 102 decreases, and the bending end E of the resisting member 104 doesn't resist the side wall 124. Then, the distance D between the first fastening member 100 and the second fastening member 102 isn't kept at the second distance D2 by the clamping force from the fastener 106 and the fixed member 2, so the movable locking ear 10 doesn't clamp the frame 12 because of the unbalanced force. Meanwhile, the movable locking ear 10 can slide relative to or separate from the frame 12. Herein, the second distance D2 is between the first distance D1 and a preset distance defined as the distance between the first fastening member 100 and the second fastening member 102 that the resisting member 104 is not compressed in this embodiment.

Figure 5:
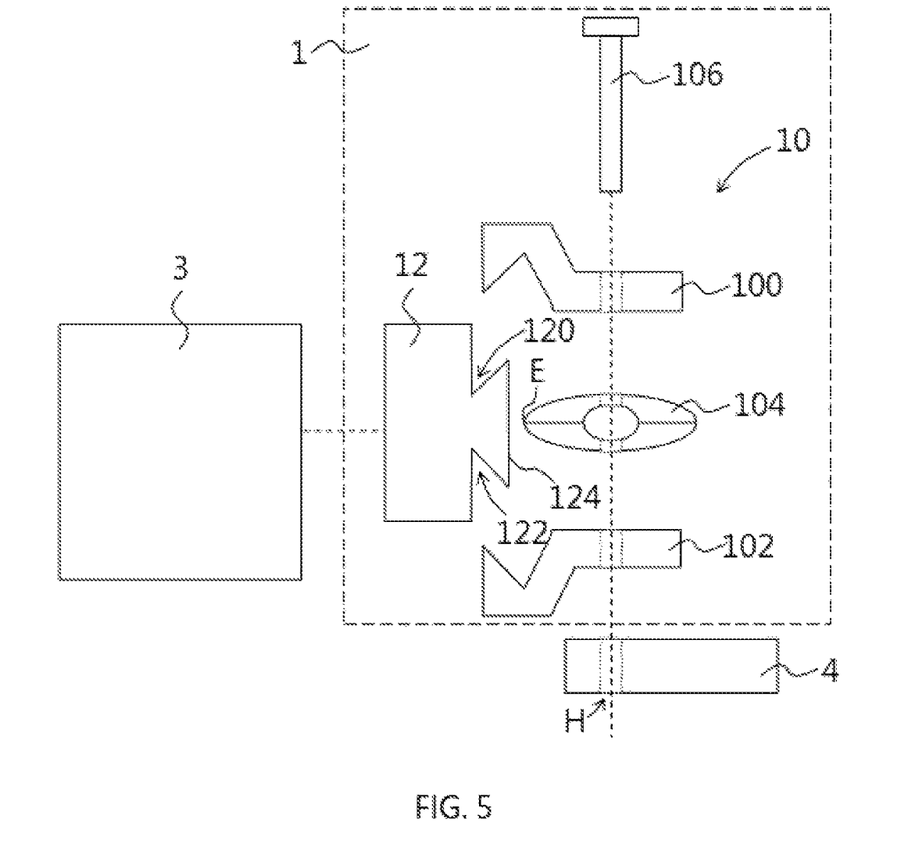
FIG. 5 is a side view of the electrical device, the object to be fixed and the circuit board in accordance with the present invention.

It is worth mentioning that the bending end E is approximately kept at a preset position, relative to the first fastening member 100 and the second fastening member 102, that the resisting member 104 is not compressed (such as the distance between the first fastening member 100 and the second fastening member 102 is not less than the preset distance) in this embodiment. However, when the resisting member 104 is compressed by the first fastening member 100 and the second fastening member 102 (such as the distance between the first fastening member 100 and the second fastening member 102 is less than the preset distance as mentioned above), the bending end E protrudes outward gradually, and it's called that the bending end E protrudes from the present position in this embodiment. In addition, a structure of mutual clamping of the movable locking ear 10 and the frame 12 as mentioned above is provided merely for exemplary purpose, and it's not limited thereto in practice. All structures that can achieve mutual clamping belong to the scope of the present invention Accordingly, the movable locking ear 10 and the frame 12 can be further combined to apply to a variety of electrical devices. Please refer FIG. 5. FIG. 5 is a side view of the electrical device, the object to be fixed and the circuit board in accordance with the present invention. An electrical device 1 is used to locked an object to be fixed 3 on a circuit board 4, wherein the object to be fixed 3 is an electronic component that can be locked on the circuit board 4 by any locking means, such as a battery pack. The electrical device 1 comprises the movable locking ear 10 and the frame 12. The frame 12 can disposed around the object to be fixed by clamping, bonding, locking and so on. The movable locking ear 10 is used to fasten the frame 12, and combined with the circuit board 4 by a mutual fitting of the fastener 106 and a screw hole H of the circuit board 4, wherein the screw hole H of the circuit board 4 corresponds the fastener 106 to make the fastener 106 rotate through. Thus, the object to be fixed 3 can be locked on the circuit board 4 by the electrical device 1. Then, a combination mechanism of the electrical device 1, the object to be fixed 3 and the circuit board 4 are further explaining below.

Figure 6A:
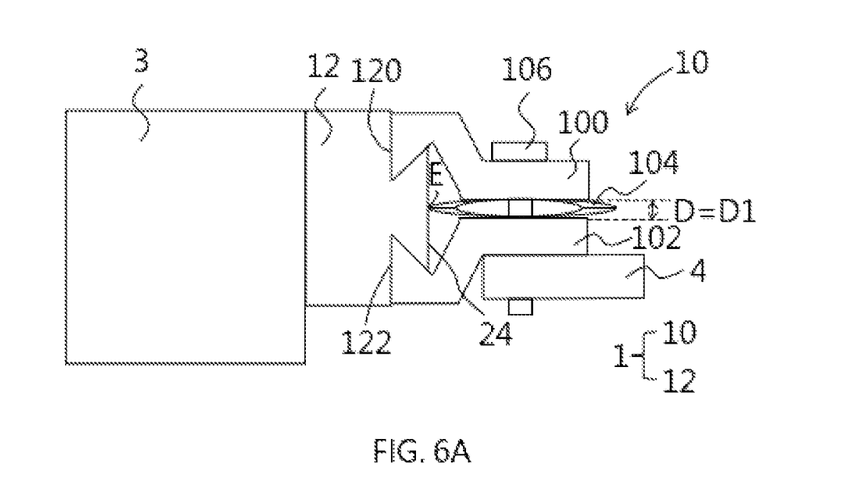
FIG. 6A is a side view of locking the object to be fixed on the circuit board by the electrical device in accordance with the present invention.
Figure 6B:
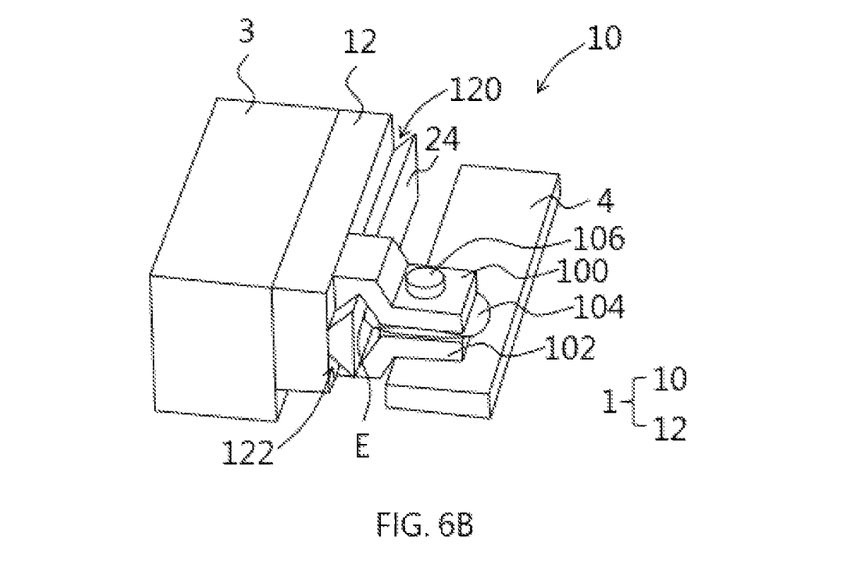
FIG. 6B is a perspective view of locking the objected to be fixed on the circuit board by the electrical device in accordance with the present invention.
Figure 6C:
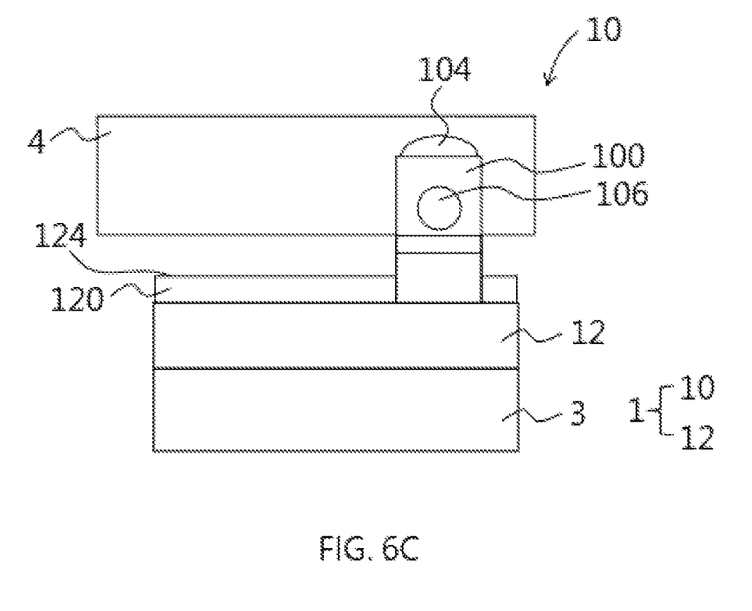
FIG. 6C is a top view of locking the objected to be fixed on the circuit board by the electrical device in accordance with the present invention.

Please refer FIG. 6A, FIG. 6B and FIG. 6C. FIG. 6A is a side view of locking the object to be fixed on the circuit board by the electrical device in accordance with the present invention. FIG. 6B is a perspective view of locking the objected to be fixed on the circuit board by the electrical device in accordance with the present invention. FIG. 6C is a top view of locking the objected to be fixed on the circuit board by the electrical device in accordance with the present invention. First of all, the frame 12 is disposed around the object to be fixed 3. Then, the first fastening member 100 and the second fastening member 102 of the movable locking ear 10 clamp the first recess 120 and the second recess 122 of the frame 12 respectively. After that, the distance D between the first fastening member 100 and the second fastening member 102 changes to the first distance D1, the resisting member 104 disposed between the first fastening member 100 and the second fastening member 1024 is compressed, and the movable locking ear 10 clamps the frame 12 because of the balanced force. Afterwards, the fastener 106 of the movable locking ear 10 penetrates sequentially through the first fastening member 100, the resisting member 104 and the second fastening member 102, and rotates through the circuit board 4. Thus, the object to be fixed 3 can be locked on the circuit board 4.

In contrast, in order to separate the object to be fixed 3 from the circuit board 4, just rotate reversely the fastener 106 until the fastener 106 and the circuit board 4 are separated. Meanwhile, the distance D between the first fastening member 100 and the second fastening member 102 changes from the first distance D1 to the second distance D2 greater than the first distance D1 because of losing the clamping force provided by the fastener 106 and the circuit board 4 (as shown in FIG. 4C). The bending end E of the resisting member 104 doesn't resists side wall 124, the movable locking ear 10 doesn't clamp frame 12 because of the unbalanced force, and the movable locking ear 10 can be detached from the frame 12, so that the object to be fixed 3 and the circuit board 4 can be separated.

Figure 7A:
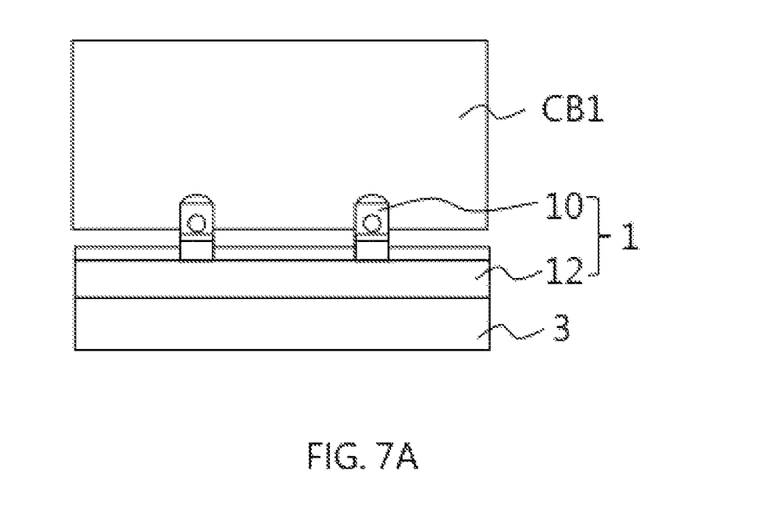
FIG. 7A is a schematic diagram of locking the object to be fixed on the first circuit board by the electrical device in accordance with the present invention.
Figure 7B:
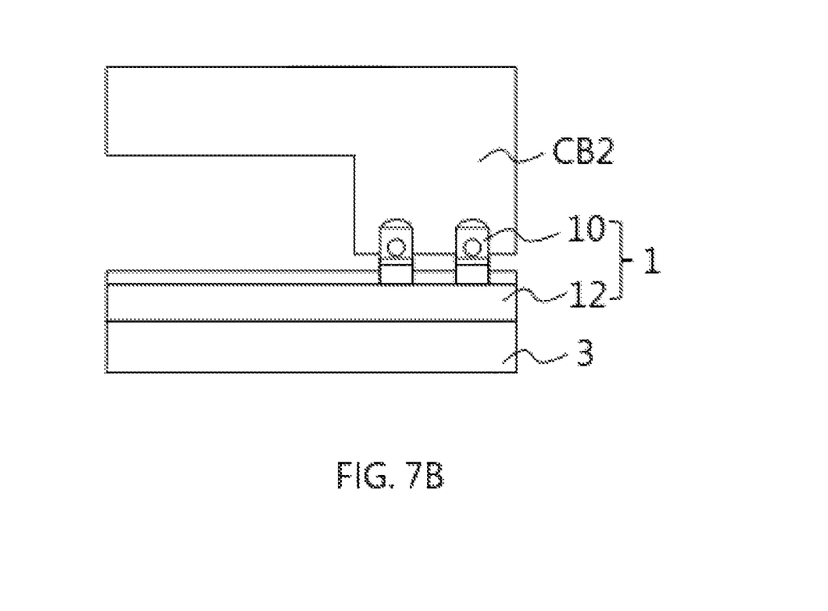
FIG. 7B is a schematic diagram of locking the object to be fixed on the second circuit board by the electrical device in accordance with the present invention.

Please refer FIG. 7A and FIG. 7B. FIG. 7A is a schematic diagram of locking the object to be fixed on the first circuit board by the electrical device in accordance with the present invention. FIG. 7B is a schematic diagram of locking the object to be fixed on the second circuit board by the electrical device in accordance with the present invention. The electrical device 1 comprises the two movable locking ears 10 and the frame 12 disposed around the object to be fixed 3, and the two movable locking ears 10 can be clamped temporarily any positions of the frame 12. As shown in FIG. 7A, in the step of locking the object to be fixed 3 on the first circuit board CB1, the two movable locking ear 10 move to positions of screw holes of the first circuit board CB1 corresponding thereto, wherein the positions are located at a long side of the first circuit board CB1 with rectangular, thus the object to be fixed 3 can be locked on the first circuit board CB1 by the two movable locking ears 10. As shown in FIG. 7B, in the step of locking the object to be fixed 3 on the second circuit board CB2, the two movable locking ears 10 move to positions of screw holes of the second circuit board CB2 corresponding thereto, wherein the positions are located at a short side of the second circuit board CB2 with L-shaped, thus the object to be fixed 3 can be locked on the second circuit board CB2 by the two movable locking ears 10.

In summary, according to the movable locking ear provided by the present invention, an user can change the distance between the first fastening member and the second fastening member to the first distance or the second distance by adjusting the fastener and the fixed member, so the movable locking ear can clamp frame, or slide relative to or separate from the frame. Comparing with the fixed locking ear with of prior art, the movable locking ears with quick-detachable of the present invention has high flexibility and applicability. In addition, the electrical device provided by the present invention can clamp any positions of the frame because of the movable locking ears with quick-detachable, so the configurations of the movable locking ears can fit with the configurations corresponding to the screw holes of the circuit boards with different types, and make the object to be fixed on the circuit boards with different types.

What is claimed is:

1. A movable locking ear, comprising:
   a first fastening member;
   a second fastening member; and
   a resisting member, located between the first fastening member and the second fastening member, and having the bending end, wherein when a distance between the first fastening member and the second fastening member is less than a preset distance, the bending end protrudes from a preset position, when the distance between the first fastening member and the second fastening member isn't less than the preset distance, the bending end doesn't protrude from the preset position.

2. The movable locking ear according to claim 1, wherein the movable locking ear is for fastening a frame selectively, the frame comprise a first recess, a second recess opposite to the first recess and a side wall located between the first recess and the second recess, the first fastening member is for fastening the first recess, and the second fastening member is for fastening the second recess.

3. The movable locking ear according to claim 2, wherein when the distance between the first fastening member and the second fastening member is a first distance, the bending end resists the side wall, and the preset distance is greater than the first distance.

4. The movable locking ear according to claim 3, further comprising a fastener and a fixed member, wherein the fastener penetrates the first fastening member, the resisting member and the second fastening member sequentially, and the fastener and the fixed member are used to keep the distance between the first fastening member and the second fastening member of the first distance.

5. The movable locking ear according to claim 2, wherein the first fastening member comprises a first body and a first clamp portion, the first clamp portion extends from an end of the first body, and is for fastening the first recess of the frame; and the second fastening member comprises a second body and a second clamp portion, the second clamp portion extends from an end of the second body, and is for fastening the second recess of the frame.

6. The movable locking ear according to claim 5, wherein the resisting member comprises:
   a first contact portion, contacting the first body of the first fastening member;
   a second contact portion, contacting the second body of the second fastening member;
   a first bending portion, located between the first contact portion and the second contact portion, and having the bending end; and
   a second bending portion, located between the first contact portion and the second contact portion, and having a stress balancing end at a position relative to the first bending portion.

7. An electrical device, comprising:
   a frame, having a first recess, a second recess opposite to the first recess and a side wall located between the first recess and the second recess; and
   a movable locking ear, comprising:
   a first fastening member, for fastening a first recess of the frame;
   a second fastening member, opposite to the first fastening member, for fastening the second recess; and
   a resisting member, disposed between the first fastening member and the second fastening member, having a bending end, wherein a position of the bending end is near to or far from the side wall with the distance between the first fastening member and the second fastening member.

8. The electrical device according to claim 7, wherein when the distance between the first fastening member and the second fastening member is between a preset distance and a first distance, the bending end doesn't resist the side wall, and the preset distance is greater than the first distance.

9. The electrical device according to claim 7, wherein the first fastening member comprises a first body and a first clamp portion, the first clamp portion extends from an end of the first body, and the first fastening member is for fastening the first recess of the frame; and the second fastening member comprises a second body and a second clamp portion, the second clamp portion extends from an end of the second body, and the second fastening member is for fastening the second recess of the frame.

10. The electrical device according to claim 9, wherein the resisting member comprises:
- a first contact portion, contacting a first body of the first fastening member;
- a second contact portion, contacting a second body of the second fastening member;
- a first bending portion, located between the first contact portion and the second contact portion, and having the bending end; and
- a second bending portion, located between the first contact portion and the second contact portion, having a stress balancing end.

* * * * *